United States Patent
Amelio

(10) Patent No.: US 12,099,087 B2
(45) Date of Patent: Sep. 24, 2024

(54) PROBE-HOLDER SUPPORT AND CORRESPONDING PROBES WITH FACILITATED MOUNTING

(71) Applicant: Microtest S.p.A., Vicopisano (IT)

(72) Inventor: Giuseppe Amelio, Lucca (IT)

(*) Notice: Subject to any disclaimer, the term of this patent is extended or adjusted under 35 U.S.C. 154(b) by 130 days.

(21) Appl. No.: 18/000,393

(22) PCT Filed: Jun. 10, 2021

(86) PCT No.: PCT/IB2021/055093
§ 371 (c)(1),
(2) Date: Dec. 1, 2022

(87) PCT Pub. No.: WO2021/250598
PCT Pub. Date: Dec. 16, 2021

(65) Prior Publication Data
US 2023/0213576 A1    Jul. 6, 2023

(30) Foreign Application Priority Data
Jun. 11, 2020   (IT) .......................... 102020000013978

(51) Int. Cl.
   *G01R 31/28*    (2006.01)
   *G01R 1/067*    (2006.01)
   *G01R 31/26*    (2020.01)

(52) U.S. Cl.
   CPC ..... *G01R 31/2887* (2013.01); *G01R 1/06705* (2013.01); *G01R 31/2601* (2013.01)

(58) Field of Classification Search
   CPC ............ G01R 31/2887; G01R 1/06705; G01R 31/2601; G01R 1/07357; G01R 1/06733
   USPC ....................................................... 324/750.25
   See application file for complete search history.

(56) References Cited

U.S. PATENT DOCUMENTS

| 2010/0231249 | A1* | 9/2010 | Dang .................. | G01R 1/0675 |
| | | | | 324/750.29 |
| 2018/0003767 | A1* | 1/2018 | Crippa ............... | G01R 1/07357 |
| 2018/0059140 | A1 | 3/2018 | Li | |
| 2019/0212367 | A1 | 7/2019 | Chih-Peng | |
| 2019/0271722 | A1* | 9/2019 | Yamazaki ............... | G01R 3/00 |
| 2019/0310287 | A1* | 10/2019 | Tadayon ............ | G01R 1/07357 |

(Continued)

FOREIGN PATENT DOCUMENTS

| EP | 2924446 | 9/2015 |
| KR | 20160074271 | 6/2016 |

(Continued)

*Primary Examiner* — Tung X Nguyen
*Assistant Examiner* — Robert P Alejnikov, Jr.
(74) *Attorney, Agent, or Firm* — Themis Law

(57) ABSTRACT

A contact probe for electronic tests includes an upper part having an end portion for contacting a first electronic component; a lower part having an end for contacting a second electronic component; and an elongated and deformable central body interposed between the upper and lower parts. The lower part has an enlarged head with a lower surface intended to rest at least partially onto a horizontal surface, the lower surface having an inclination angle from the horizontal surface onto which it rests when the probe is unbuckled and, when the probe is buckled, it can assume a position in which the lower surface moves to rest entirely onto the horizontal surface, thereby eliminating the inclination angle.

16 Claims, 9 Drawing Sheets

(56) References Cited

U.S. PATENT DOCUMENTS

2020/0018779 A1* 1/2020 Kato .................. G01R 31/70
2021/0003610 A1* 1/2021 Pak ................... G01R 31/2886

FOREIGN PATENT DOCUMENTS

TW       I640782     11/2018
WO     2010061857     6/2010

* cited by examiner

MOUNTING PHASE         FINAL MOUNTING

PROBE-HOLDER SUPPORT AND CORRESPONDING PROBES WITH FACILITATED MOUNTING

FIELD OF THE INVENTION

The present invention relates to the technical field of probes and probe-holder supports used to carry out tests on electronic devices.

Specifically, the invention relates to a particular probe-holder support structure and corresponding probes (on the whole defined with the term "probe head") capable of enabling a facilitated assembly and a better functionality during test.

BRIEF OUTLINE OF PRIOR ART

Probe cards for electronic tests have long been known and used.

The "probe card" is an interface between test system and wafer, used during test of devices. Its purpose is to connect electrically circuits of the device (in the wafer) and resources of tester (see FIG. 1 prior art).

As schematized in FIG. 2, still prior art, typically a "probe card" is in its turn formed by:
A "PCB" 3 (acronym for "printed circuit board");
A framework 4 to ensure planarity and;
A probe head 1, that is the structure inside which probes are positioned.
Sometimes an "interposer" 2 could be present to connect PCB and probe head.

The probe head 1 is made up by a structure that keeps probes in position and by the probes themselves.

In the case of vertical probes, typically it (i.e. the probe head) comprises two generally ceramic perforated plates which act as a guide and where probes are inserted. Such ceramic plates are in the form of an upper ceramic plate and a lower ceramic plate that are generally defined in technical jargon as "Guide Plates" and they are indicated in FIG. 2 with the numbering (1Top) and (1Bot) (i.e. upper and lower).

When coupled, they form the inner seat in which probes are housed with the probe ends protruding from such ceramic plates through holes so as to be in contact with the wafer on one side and on the opposite side with the electrical communication towards PCB (see FIG. 2).

Such upper and lower ceramic plates have at their ends (FIG. 2 shows the left and right end in section) a vertical extension (EV) like a column that branches off vertically from the flat surface (SP).

In this way, as it is well inferable from FIG. 2, the upper and lower plate are in direct contact to each other through such vertical extensions (EV) that represent a contact edge of the two said plates. With respect to them, the flat surface of the plate (SP) is raised thus forming the seat for probes.

In addition, the coupling between the upper plate (1Top) and the lower one (1Bot) is helped by two further supports (Sup1, Sup2) positioned like a bearing column at the two ends of the seat, thus delimiting the same seat on the right and on the left (still see FIG. 2).

Further supports can be only one of annular shape in the case that the entire probe head is circular depending on shapes. In fact, FIG. 2 shows a section thereof.

Even if structurally complex, this structure enables the correct mechanical functioning of probes which buckle inside the probe head during the contact with wafer, thus enabling to manage dimensional and geometrical tolerances of parts and to keep the contact force under control.

Thus, during test, electrical signals are sent from the machine and they are transmitted through the pcb to the wafer by means of probes (see FIG. 1).

Probes are inserted into the support forming part of the probe head and must have electrical and mechanical properties.

They must have electrical properties because their purpose is to contact pads in the wafer with the contacts of pcb of the probe card. They must have mechanical properties because they must ensure the electrical contact for numerous test cycles, bearing continuous buckles without damaging the wafer, thereby enabling to manage dimensional and geometrical tolerances of the parts and to keep the contact force under control.

Thus, they must have a geometry and optimized materials.

A particularly felt technical issue concerns the facility of assembly of probes in their support (i.e. the probe head 1 described in prior art) and solicitations to which the same probe is subject during its functioning.

At the current state of art, solutions do not enable an easy assembly of probes in their support and the probe, during its working cycle, is subject to high solicitations which reduce their lifespan.

Publications KR20160074271, WO2010/061857 and EP2924446 are further known.

SUMMARY OF THE INVENTION

Therefore, the aim of the present invention is to provide a new solution which lessens at least the above-mentioned problems.

In particular, the aim of the present invention is to provide a new geometry of probe which reduces remarkably the probabilities of damaging the probe and facilitates its mounting at the same time.

These and other aims are achieved with the contact probe, according to claim 1.

Such contact probe (10) for electronic tests comprises:
An upper part (12) having an end portion (12') whose end is intended to contact a first electronic component;
A lower part (13) having an end portion (13c) whose end is intended to contact a second electronic component;
A generally elongated and deformable central body (11), said central body being interposed between said upper part and lower part;

According to the invention, said lower part (13) comprises an enlarged head (13D) having a lower surface (13D') which in use is intended to rest at least partially onto a horizontal surface (25, X), preferably or generally the lower plate.

Such lower surface (13D') is thus configured so as to form, in a rest condition of the unbuckled probe, an inclination (x) with respect to the horizontal surface (25, X) onto which it rests.

Therefore, in a rest condition, it rests onto a limited area of the entire lower surface (13D') for example that can also be assimilated to a point.

In condition of buckle of the probe, there is instead at least one buckled position in which said lower surface (13D') moves to rest entirely or substantially entirely onto the horizontal surface thus zeroizing said angle (a).

Thus, the lower surface (13D') has a working which entails an oblique cut and thus the formation of such surface with a certain inclination with respect to a horizontal plane (see FIG. 6).

Thanks to such probe configuration, when it is buckled in work condition, or measurement condition, a sort of roto-translation occurs such that it entirely rests through such lower surface (13D') onto the surface of the lower plate and then it discharges the buckling force onto the support surface in a normal way, i.e. orthogonally.

This enables much more stability of the probe and thus measurement precision.

As explained below, the bevel generating the lower surface (13D') has generally small angles, for example comprised between approximately 1 and 7 angular degrees.

On the basis of the description above, a probe head is described here as well, comprising:

One or more contact probes (10);
An upper plate (20) provided with one or more holes;
A lower plate (25) provided with one or more holes aligned with the holes of the upper plate;
At least one connection support (31) for connecting the upper plate to the lower plate maintaining them spaced from each other for forming a seat for housing the probes;
And wherein each probe comprises:
An upper part (12) having an end portion (12') at least partially protruding from the hole of the upper plate so that the end can be in contact in use with a first electronic component;
A lower part (13) having an end portion (13c) at least partially protruding from the corresponding hole of the lower plate so that the end can be in contact in use with a second electronic component;
A generally elongated and deformable central body (11), said central body being interposed between said upper part and lower part and being housed in said seat;
And wherein said lower part (13) of the probe comprises an enlarged head (13D) having a lower surface (13D') which rests onto the surface of the lower plate (25) and with said lower surface (13D') configured so that, in rest condition of the probe when it is not buckled, said lower surface (13D') is inclined of a certain angle (a) with respect to the surface of the lower plate (25) and, after the buckle of the probe in work condition, said lower surface (13D') is entirely lying onto the surface of the lower plate thus zeroizing said angle (a).

Advantageously, the lower plate (25) can be mounted slidingly along at least one vertical guide (32) with respect to the support (31) so that said lower plate (25) is movable between a position spaced from the support (31), in which said probe is in rest condition, and a position in which the lower plate is in contact against the support and with the probe which is, in said position of the lower plate, buckled in said work condition.

This solution greatly facilitates the mounting of the probe head assembly.

Here is also described a method for mounting a probe head according to the description above and comprising the insertion phases of the probes from the holes of the upper plate (25) so that each probe is positioned with the opposite end protruding from the corresponding hole of the lower plate (20), the lower plate being arranged with play with respect to the support (31) to which it is fixed and wherein, after the insertion of all the probes, the sliding phase of the lower plate along the guide thereof is provided so as to move it against the support (31) thus zeroizing the play and positioning the probes in buckled work position in which, in said buckled position, the lower surface (13D') of the probe is entirely lying onto the surface of the lower plate.

Further advantages can be inferred from dependent claims.

BRIEF DESCRIPTION OF THE DRAWINGS

Additional features and advantages, according to the invention, will become apparent from the following description of embodiments thereof, given only by way of non-limiting example, with reference to the attached drawings, wherein:

FIG. 6 is an enlarged detail of the probe while

DESCRIPTION OF SOME PREFERRED EMBODIMENTS

Figure 3:
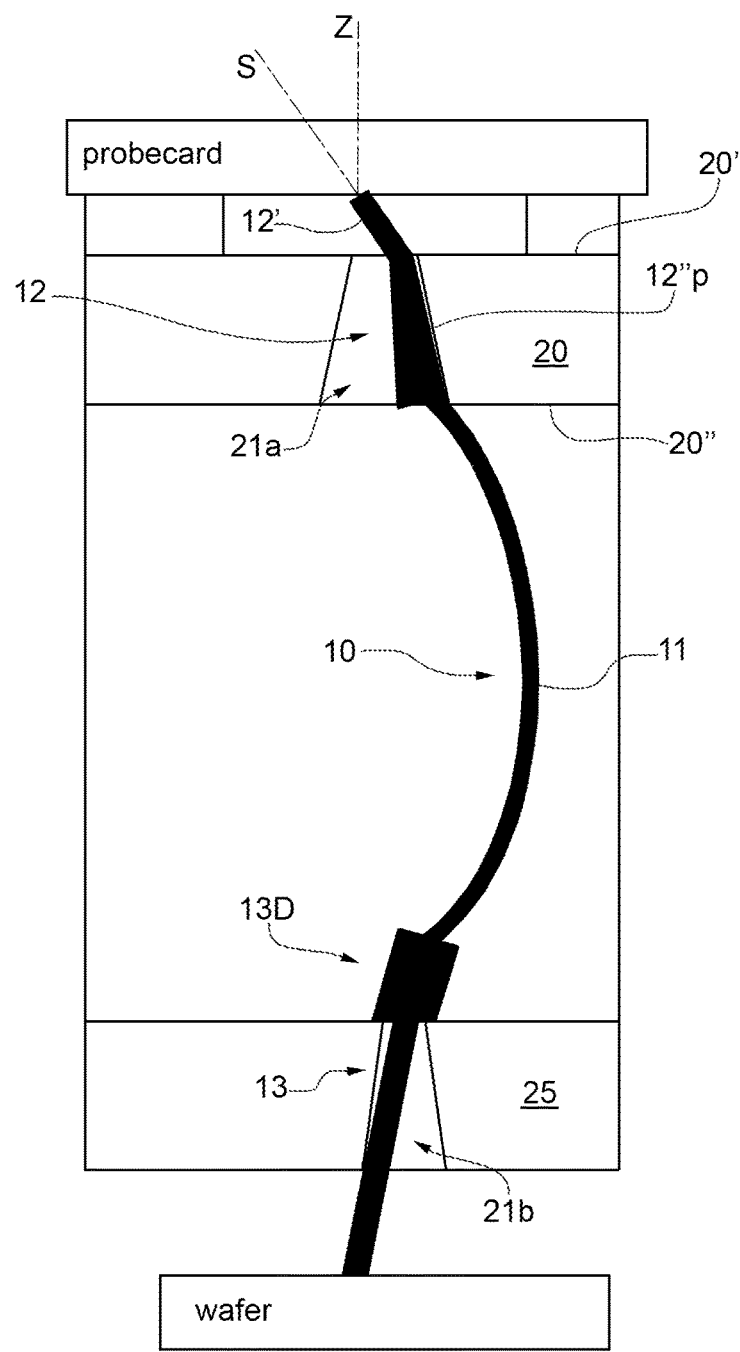
FIG. 3 shows a view of the probe, according to the present invention, mounted in its support (as a whole probe+support defined as probe head)

FIG. 3 shows a probe 10 with a particular geometry described below and positioned in the seat delimited above by the plate or upper stopper (20) and below by the plate or lower stopper (25) (they are generally ceramics).

Figure 9:
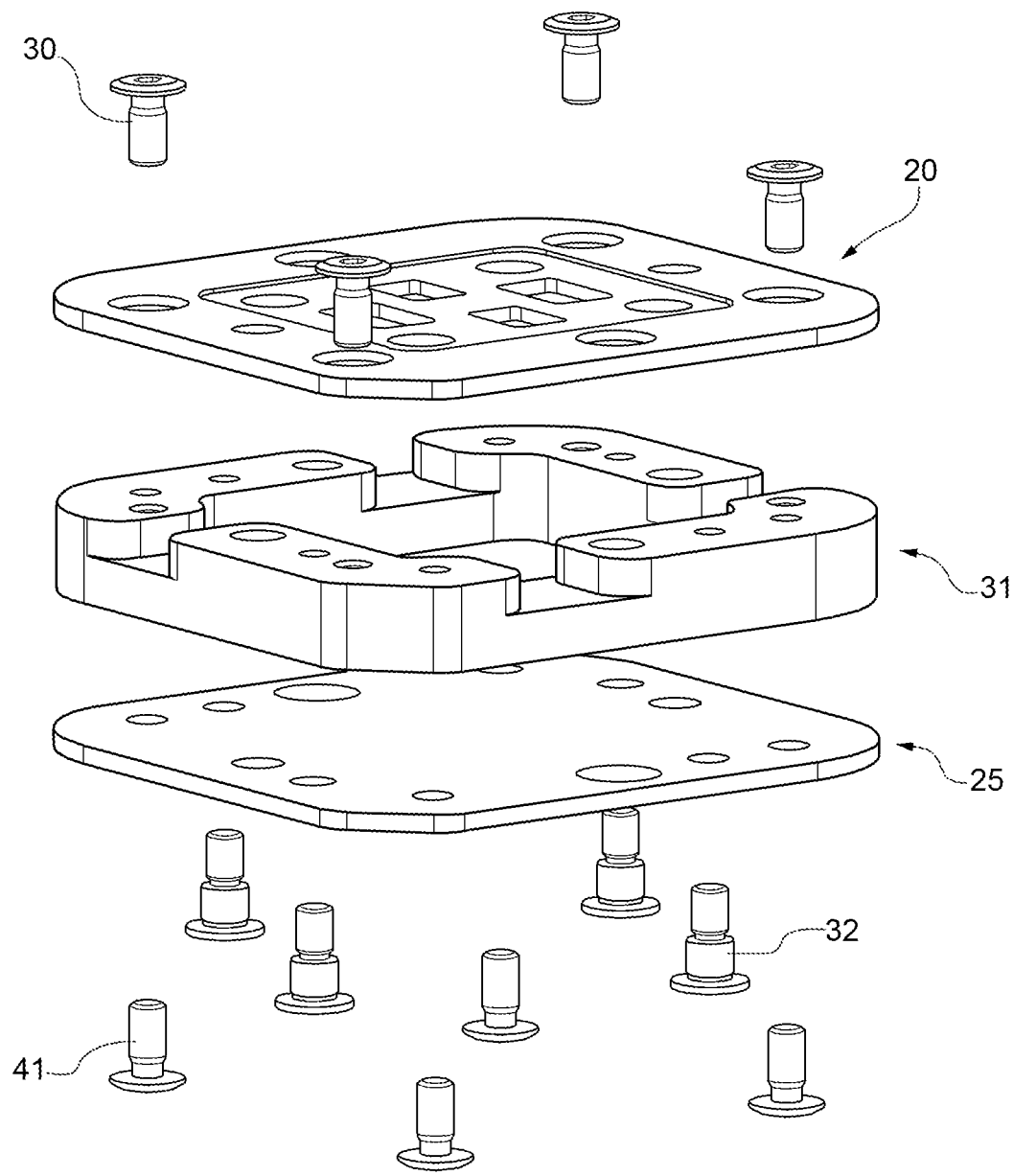
FIG. 9 schematizes, in a three-dimensional view, the ceramic top 20, the ceramic bottom 25, the interposed annular support 31 which form as a whole the passage seat of probes (not shown in figure) so as to generate the probe head. In addition, fixing screws and guides 32 (four in total) are highlighted.
Figure 10:
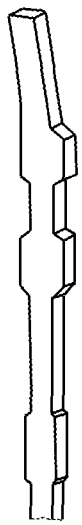
FIGS. 10 and 11 are enlarged details of the probe relative to the upper part (FIG. 10) and the part which rests during buckling to discharge force normally (FIG. 11).

Differently from the introduced prior art, the upper plate and the lower plate are of substantially flat shape so that they do not form such perimetrical edge like a column, as per the prior art, through which they are in contact. This is also highlighted in FIG. 9 showing top and bottom 25.

Figure 4:
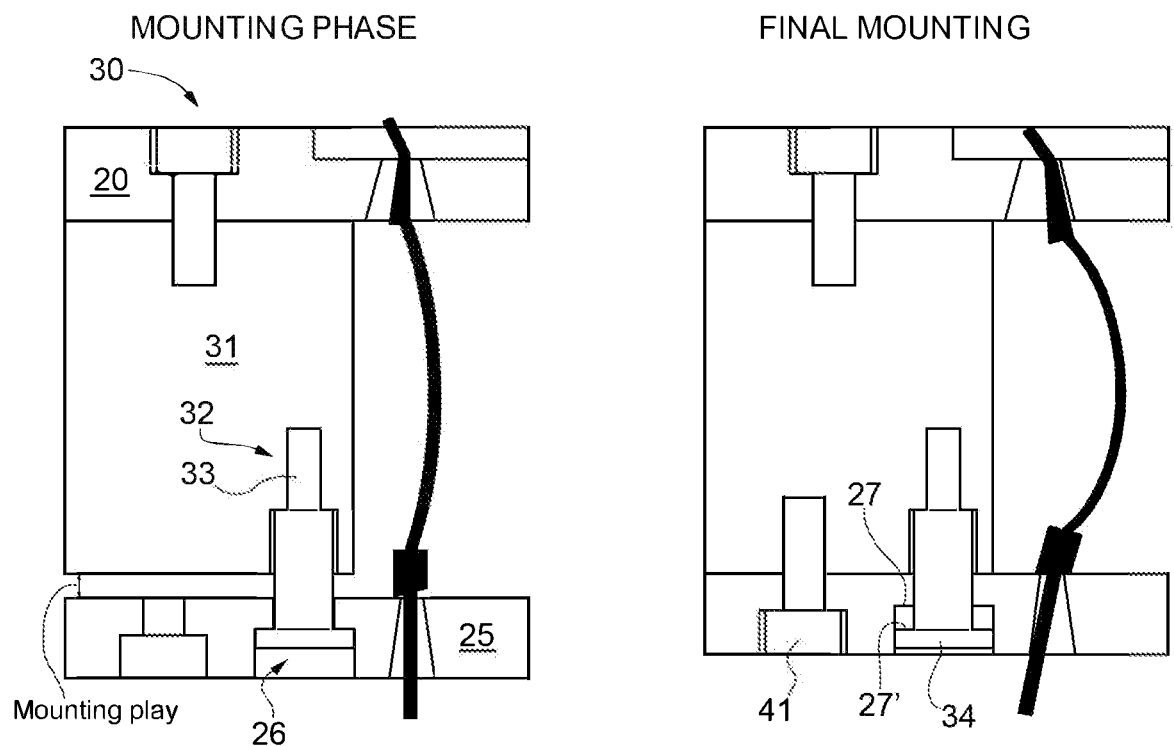
FIG. 4 shows in section a left portion of the probe head and highlights the probe which has not been pre-charged in the mounting phase and the pre-charged probe after the final mounting.

Specifically, as shown in FIG. 4, in correspondence of their ends (since FIG. 4 is a section of a part of the probe head, it only shows the left end) top and bottom are not in direct contact with each other. In such type of solution, the support 31 is instead interposed (generally of annular shape as per FIG. 9) and its presence is also evident in FIG. 4.

Therefore, differently from prior art, top and bottom are without columns (EV) (see comparison between FIG. 2 prior art and FIG. 4) and are two substantially flat elements for their entire extension surface.

In fact, FIG. 4 shows an end part, particularly the left one, where the portion of upper and lower stopper is highlighted, they are substantially flat and without the vertical extension (EV) of prior art such that they are not in direct contact with each other.

According to the present solution, as shown in FIG. 4 and FIG. 9, now the support 31 is instead interposed between the two upper and lower plates such that said two plates, with a substantially flat shape are separated from each other and joined only through the support 31 which spaces them and delimits the seat for probes together with connection means described below.

The position of support 31, although represented in FIG. 4 in correspondence of the edge of plates, could also be inside the edge or in a position generically near to the edge and be of variable widths depending on constructive needs.

Therefore, the upper stopper is fixed to the interposed support 31 with suitable screws or bolts in general 30 schematized in FIG. 4.

The lower stopper 25 has a certain "play" with respect to the bearing structure 31 and it is well highlighted in FIG. 4 with the wording "Mounting play".

As clearly shown in FIG. 4 on the left ("mounting phase"), a centering pin 32 is provided which inserts into a suitable hole 26 of the lower stopper 25. The assembly is such as not to prevent the lower stopper 25 from sliding vertically towards the upper stopper 20 and thus towards the support 31.

In fact, the hole 26 forms for this purpose a countersink, i.e. an enlarged part, which houses the enlarged head of pin 32.

The pin 32 has a threaded front part 33 which engages with a corresponding threaded hole of the support 31 while the opposite part to the threaded one, i.e. the rear part 34, forms an enlarged head 34 which inserts into the countersink of hole 26.

When the pin 32 is inserted into the lower stopper through the hole 26, its front part 33 engages with the threading of support 31 thoroughly to the threaded hole. The length of pin 32 is such that, once screwing has been completed, the plate 25 is still spaced from the support 31, position indicated in FIG. 4 on the left (mounting phase) with the enlarged head 34 which stops against the shoulder 27 of the hole countersink. Essentially, in this position, the shoulder 27' formed by the enlarged head 34 of pin 32 goes bucks against the shoulder 27 of countersink of hole 26. Essentially, in this position the shoulder 27' formed by the enlarged head 34 of pin 32 bucks against the shoulder 27 of countersink of hole 26 keeping the plate raised at the play distance shown in FIG. 4.

In this way, the pin 32 becomes a vertical sliding guide which enables to guide along it the plate 25 in an approaching/moving away motion to/from the support 31.

The guide plate 25, when the pin 32 has been screwed and the screw 41 has not been screwed, is then free to approach and move away from the support 31 to a maximum distance named "mounting play".

The thickness of pin head 34 is lower than the total depth of countersink of hole 26 into which the pin is inserted and the depth of countersink is such that, when the lower plate is brought to the shelter of support 31 thus zeroizing the play, the pin head 34 is still hidden inside the hole 26 (see FIG. 4 "final mounting").

Therefore, the pin 32 screws thoroughly to the support 31 and in this position the length of screw 32 is such as to keep the lower plate 25 at a certain distance (named "mounting play" or play) with respect to the support 31. The pin 32 acts as a guide for vertical sliding and when the lower plate 25 approaches in contact with the support 31, then the probe positioned inside between the upper and lower plate bends and said bent (or generically buckled) position is kept after the lock of plate 25 near support 31. Said lock of plate 25 to the support 31 without play occurs thanks to the fixing screw 41 (preferably four fixing screws), which is also screwed into the support 31 through the plate 25 but with such a length that, when thoroughly screwed, it forces the plate to buck against the support 31 (exactly like the solution of the upper plate 20).

As well shown in FIG. 4 on the right (final mounting), the lower stopper 25, thanks to pin 32, is in this way vertically sliding along the pin 32 which acts in this way as a vertical guide, such that the lower pin 25 can approach/move away from the upper stopper 20 according to an orthogonal direction to the plane of the two said stoppers, precisely because the pin acts as a guide.

Before fastening the screw 41 and locking the whole, the probe head must be mounted onto the probe card. Then the whole can be fixed with the screw or bolt 41 which brings the plate 25 against the support 31 and with probes in bent work condition.

It is obvious that the probe head must be mounted onto the probe card/interposer before tightening screw/s or bolt/s 41 given that otherwise the probe would not have any surface to contact on the side of the plate 20 thereby being free to jump out through the passage hole made in the plate itself.

In fact, in FIG. 4 on the right (final mounting), the probe is shown in bent work position and no element in contact with the probe is shown above the plate 20 with the sake of simplifying the drawing only. It is obvious that without an element which is in electrical contact with the probe the probe itself would jump out of the hole.

In this embodiment, the probe buckles elastically, for example it bends, and pre-charges but with a stress reduction achieved thanks to the conformation of the probe itself described below.

Figure 7:
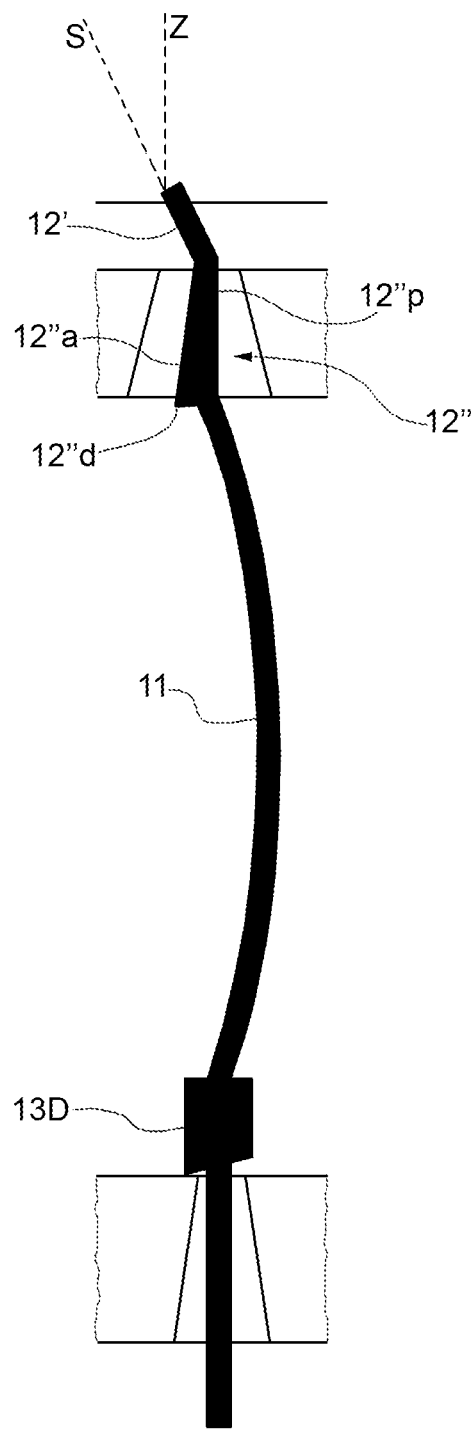
FIG. 7 shows a view of the probe which has not been pre-charged yet.

Specifically, with reference to FIG. 3 and FIG. 7, the probe 10 has an upper part 12 which connects to the central curved shank 11 (the part which bends or buckles in general). On the opposite side the lower part 13 is provided which connects to the central shank 11.

The upper part 12 ends with a contact part 12' equipped with a contact tip which in use contacts the probe card.

Therefore, such contact part 12' has a certain inclination with respect to the plane of the probe card (see the inclination of axis (Z, S) in FIG. 3 and in FIG. 7).

The angle between the direction of the contact part 12' and the axis Z (axis orthogonal to the plane of the probe card) obviously changes from a rest condition of the probe (as per FIG. 7) and a pre-charging condition in which the probe is bent or buckled in general (as per FIG. 3).

The contact part 12' connects to the part 12" with the following conformation described specifically in FIG. 7 (unbent probe condition).

A rear wall (12"p) parallel to axis Z and a front wall (12"a) with geometry suitable for being handled.

Specifically, such front part (12"a) forms a side opposite to the rear part (12"p) which progressively moves away from it according to a certain angle and then connects again to the central body 11 through a transversal part (12"d), thus forming a sort of tooth or step (12"d).

Therefore, considering a reference axis Z as per FIG. 7, the wall (12"p) is parallel to axis Z while the front wall (12"a) forms an inclined side with respect to said wall (12"p).

Figure 6:
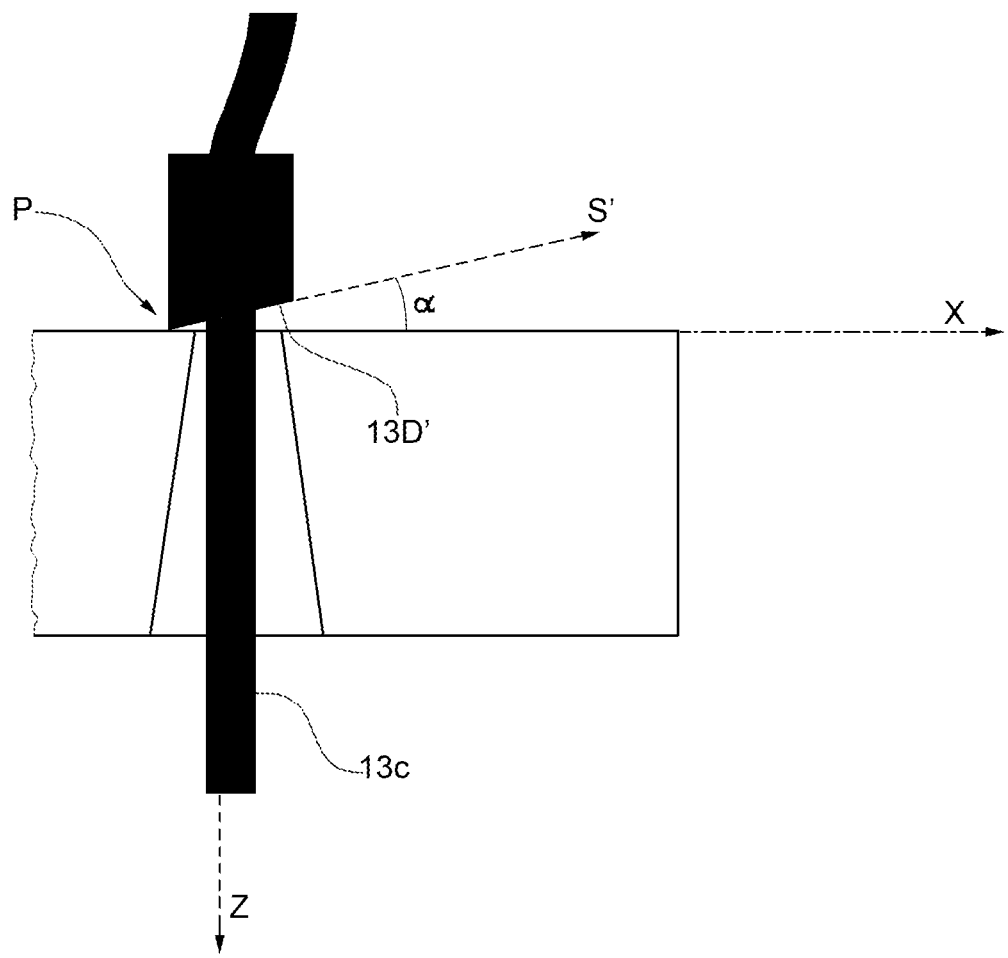

The axis Z is an axis orthogonal to a horizontal reference plane X (see for example FIG. 6).

Through such conformation, the probe can be handled in a precise and repeatable way by a manipulator.

The production process of probes provides for their mounting onto a suitable support which allows their electrochemical growth and all the subsequent processes after growth. At the moment of mounting the probe head, such probes must be taken by a manipulator and transferred inside the holes present on the ceramics of the ceramic plates (i.e. the upper and lower plate). Thus, such manipulator holds probes from the portion (12) described above, which must have a suitable geometry adapted to make the manipulator hold strong and repeatable, in accordance to the description.

Figure 8:
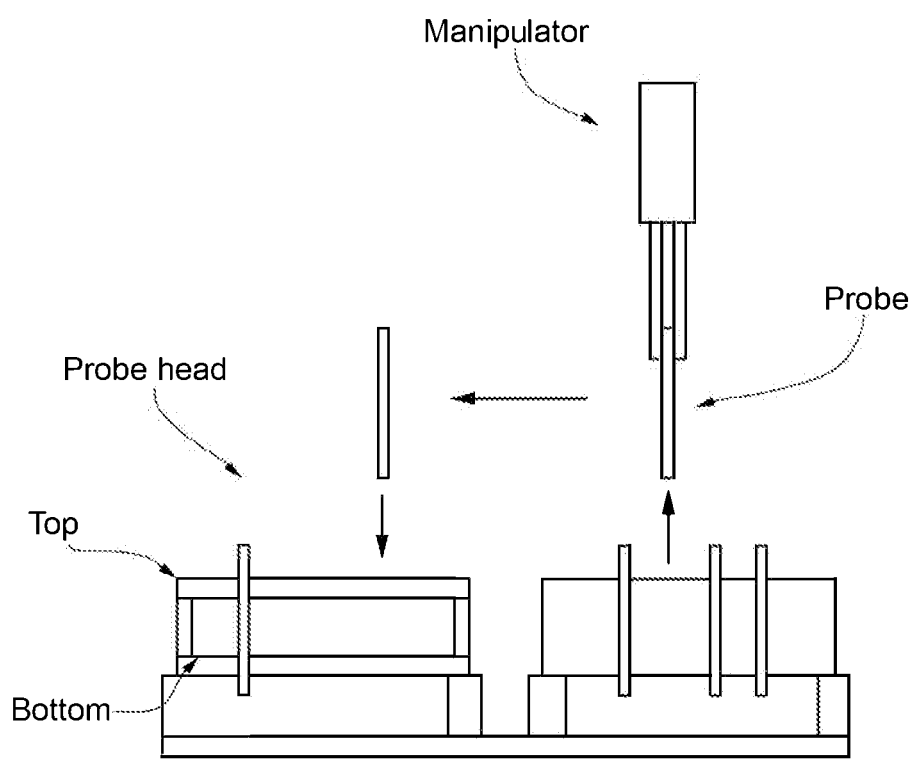
FIG. 8 schematizes a manipulator to apply probes to the probe head.

FIG. 8 broadly shows a schematization concerning the manipulator hold. The geometric detail of the holding area can be obviously varied depending on needs.

Specifically, as described, the front wall (12"a) progressively moves away from the rear wall (12"p) in such a way as to connect then to the central shank 11 of the probe, receding with a part (12"d) which forms a protuberance or tooth.

Therefore, the upper stopper 20 has the hole 21 to enable the insertion of the probe to control its buckling way.

The hole 21 is generally frustoconical and then it provides a conical wall which enlarges diametrically starting from the surface 20' towards the surface 20" (see FIG. 3).

This hole conformation facilitates centering and inserting the probe from above through the upper plate. The inclination of the lateral wall of hole 21, i.e. the conical wall, enables in use to the surface (12"p) to lie entirely onto said lateral wall of hole 21 as shown in FIG. 3 and as explained below, after buckling.

The lower part of probe provides instead an enlarged head (13D) with an inclined lower base, i.e. with a certain inclination (like an inclined plane).

Specifically, the enlarged head comprises an upper surface which connects to the body 11 and, from the opposite side, a lower surface. The two upper and lower surfaces are not parallel to each other.

In fact, in an unbuckled condition of the probe and thus in rest condition, the lower surface is inclined of a certain degree with respect to the horizontal reference plane (like an inclined plane).

Figure 11:
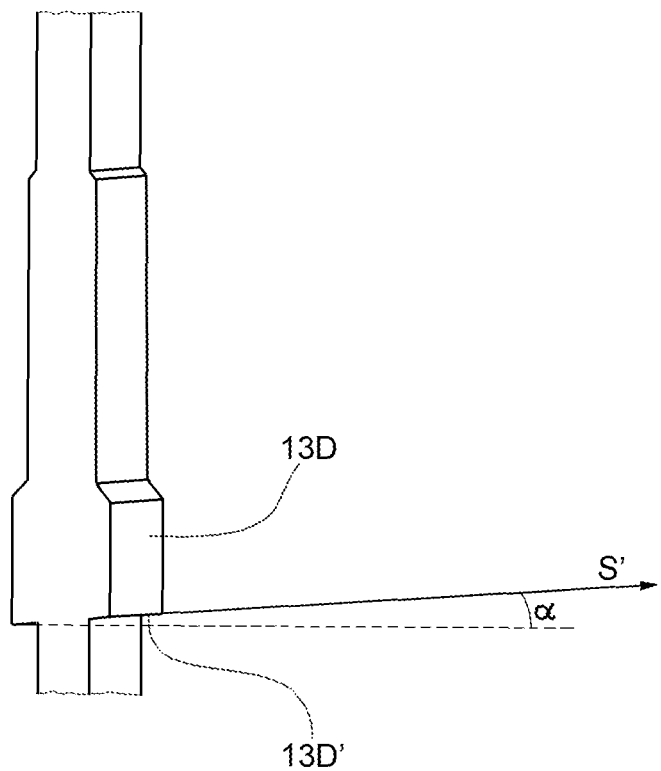

More specifically, the enlarged head (13D) is formed by a body (FIG. 11 shows a geometry in axonometry thereof), whose lower basis is an inclined surface of a certain angle with respect to a horizontal plane (X) (see enlarged FIG. 6 angle (a) between axis X and axis S' or rather FIG. 11).

Such lower inclined basis (13D') is on the opposite side to the connection with the part of central flexible or deformable body 11. As shown in FIG. 6, the contact part (13c) continues from it which protrudes from the hole of plate 25 to create the contact with wafer.

The hole 25 is frustoconical as well in such a way as to enable, also in this case, a certain excursion of the contact part (13c) after buckling (the same is for the hole of the upper plate).

Figure 5:
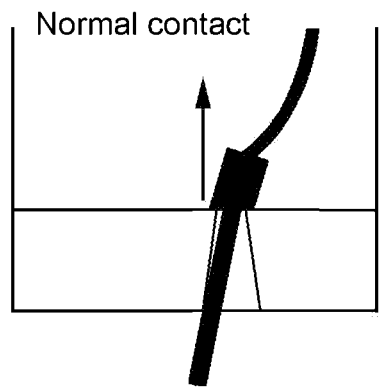
FIG. 5 is a detail of how such probe configuration discharges the force according to a normal direction to the plane.

In this way, in use, during the probe bending, the head (13D) is dragged to a movement due to the overall buckling of the probe thereby bringing the inclined plane (13D') constituting the lower base of the enlarged head, as mentioned, to contact entirely the surface 25, thereby discharging normally force as per FIG. 5 and reducing the cutting load. Essentially, in a buckled configuration, the enlarged head 13 of the probe firmly rests onto the surface constituting its support base (13D').

In this buckled configuration, the opposite part of the probe, i.e. the part 12 inserted in the hole 20 will be with the surface (12"p) resting onto the hole's wall.

Therefore, the probe geometry is such that, after buckling, the enlarged head (13D) which rests onto the lower plate 25 lies with its base (13'D) entirely or almost entirely onto the surface of lower plate 25 discharging the force normally (i.e. in an orthogonal way to the surface of plate 25) and, contextually, the opposite part 12 inserted in the hole 20 rests onto the wall of hole with the rear part (12"p).

Therefore, dimensionally, both the probe geometry, including its length, and the support geometry (upper and lower plate and corresponding reciprocal distance) are such that in buckled position the probe is in the configuration of FIG. 5, i.e. with the inclined side (13D') in contact through its entire surface area which constitutes it with the plate surface.

Essentially, in an initial condition, as per FIG. 6, the probe touches the lower plane 25 in a point (P) while, after buckling, the entire surface (13D') rests onto the plane 25 after inclination of the probe, thereby zeroizing the inclination angle f surface (13D') and discharging force onto the support plane with a reaction orthogonal to the support plane.

Therefore, this kind of probe structure correlated to geometry of plates inside which it is mounted, enables the probe to be correctly and above all firmly positioned, firmly resting onto the lower plate 25 and close to the hole in contact with a wall thereof in correspondence of upper plate.

This gives great stability and ensures an optimal reliable functioning.

As shown in FIG. 3 and in FIG. 7, the probe is structurally an elongated body having a longitudinal development line thereof (obviously of electrically conductive material).

Such longitudinal development line comprises the central part 11 (or central body) normally with a constant section.

Such central part 11 is generally curved and thus has a certain radius of curvature which obviously increases when the probe is bent in use.

This central part, as still shown in FIGS. 3 and 7, is comprised between two portions, i.e. the upper portion 12 (or first portion 12) whose end is intended to contact the probe card in use and the lower portion 13 (or second portion 13) whose end in intended to contact wafer in use.

FIGS. 3, 6 and 7 show as axis Z an axis orthogonal to a plane X and thus an axis orthogonal to the plane of probe card and of wafer after mounting, or in an equivalent way an axis orthogonal to the two plates 20 and 25 between which the probe is comprised when mounted in its probe head.

The so-called enlarged head (13D), as shown in FIG. 6 for example, represents an enlargement area of transversal section relative to central part 11. Essentially, moving along the development line of the central part 11, generally with transversal constant section, an area where such transversal section is greater is intercepted and this represents the enlarged head (13D) which has a predetermined longitudinal length.

As shown in FIG. 6, the enlarged head branches off from the central part 11 enlarging in a symmetrical way from a side and from the other side of the central part (see also FIG. 11).

The enlarged head forms a base (13D') which is beveled. Therefore, it is inclined of a certain angle with respect to a hypothetical horizontal support plane which is represented by surface 25 of FIG. 6 when the probe is positioned in orthogonal position with its axis Z of FIG. 6 with respect to such support surface 25. Essentially, said base (13D') of the enlarged head forms a bevel with a certain angle with respect to an above-described plane orthogonal to the axis Z.

Such angle is preferably comprised in a range between 1 and 7 degrees.

As per FIG. 6, a last part with reduced transversal section connects to such enlarged head which retraces the measure of transversal section relative to the central body 11 and with longitudinal development according to the defined axis Z.

Therefore, for mounting the entire probe head, the upper plate 20 is connected to the support 31 with the screw or anyway with connection means 30.

The lower plate 25 connects with vertical play with respect to the support 31, through the pin 32 already described above.

Therefore, in this case, the lower plate 25 is spaced from the support 31.

All probes are inserted through the holes of the upper plate.

Each hole of the upper plate has obviously its corresponding one aligned with the lower plate as shown in FIG. 4, even if FIG. 4 shows only one couple of holes and then a single probe, only for sake of simplicity.

The diametral width of the hole relative to the upper plate 20 is such that the whole probe can be inserted into the space between the two plates (20, 25) exactly as shown in FIG. 4.

Specifically, the probe part intended to rest onto the lower plate 25, i.e. the enlarged part (13D) has such a maximum diametral width as to pass through the hole 21 of the upper plate 20 without being able to pass through the corresponding hole of plate 25 onto which it rests.

Figure 1:
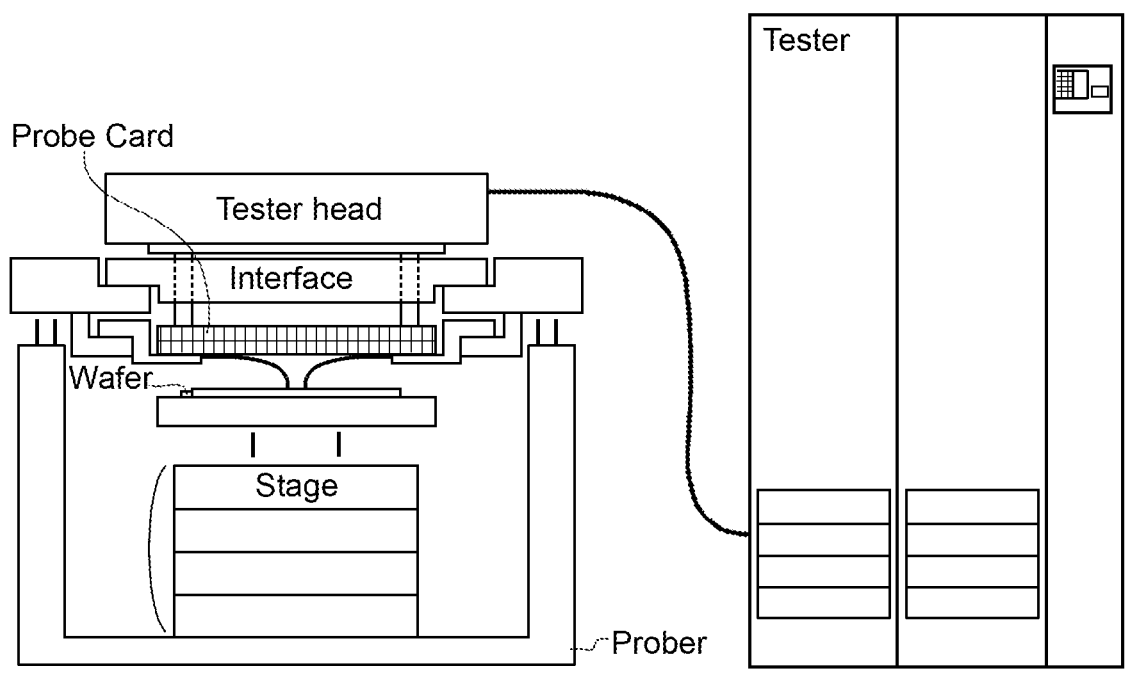
FIG. 1 and FIG. 2 describe solutions of prior art.
Figure 2:
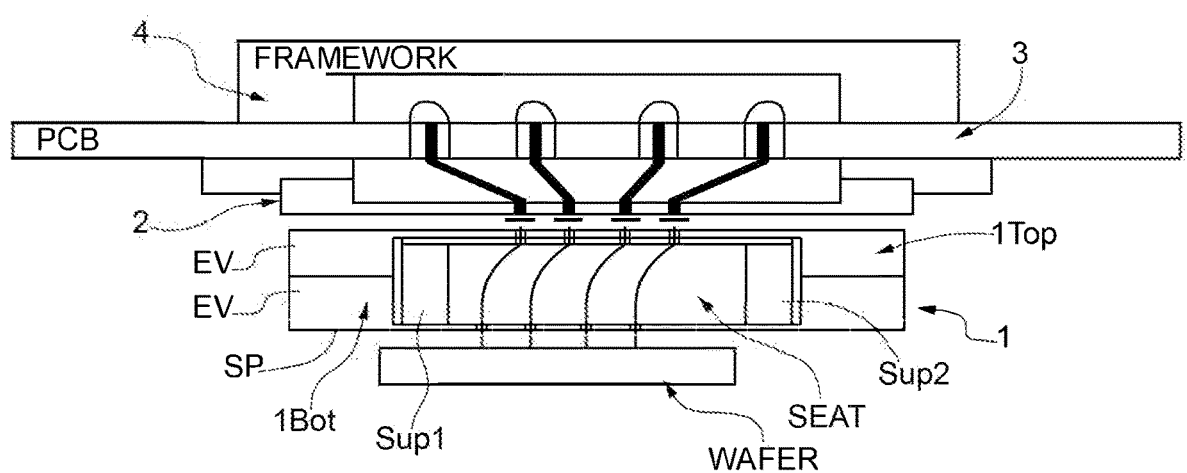

Once all probes have been arranged, the entire assembly upper-lower plate and probes which shape the probe head, is positioned in work position thereby positioning it as per the prior art between PCB and wafer with reference to FIG. 2.

In this way, probes will be on one side (the one corresponding to the lower plate 25) in contact with wafer and on the opposite side in electrical contact with PCB.

Once the probe head has been arranged, screws or connection means 41 in general relative to the lower plate are tightened to eliminate play and make the lower plate 25 buck against the support 31 as per FIG. 4 (final mounting) and to put all probes in buckling work condition.

In this condition, as per FIG. 5, the base of enlarged head entirely rests onto the plate's plane thus discharging force in normal way.

Essentially, the inclination of support base (13D') of enlarged head (13D) is such that, when the probe has been pre-charged and buckles, such support base rotates from the position of FIG. 6 to the position of FIG. 5, entirely resting onto the plane of plate 25 and discharging force according to a normal direction.

Obviously, as clearly visible from attached drawings, the lower plate 25 has a preferably conical hole and anyway having such a diameter as to stop the passage of enlarged head (13D) (see for example FIG. 7).

As already described, the probe goes on downstream of the enlarged head (13D) with an end contact part passing through the hole (21*b*) of lower plate 25 and representing the other portion in electrical contact with wafer.

As a whole, this solution is stable and functional and makes mounting much simpler with respect to prior art.

Obviously, as per the prior art, the constructive material of probes is electrically conductive material.

Therefore, a subject of the present invention is a contact probe (10) for electronic tests suitable to be inserted into a seat delimited by an upper plate (20) and a lower plate (25) in such a way as to form a probe head, said probe having a longitudinal development comprising:

An upper part (12) insertable in use into a hole made in the upper plane and having an end portion (12') protruding in use from said hole and whose end is intended to contact a first electronic component, for example in the form of a probe card;

A lower part (13) having an end portion (13*c*) insertable in use into a hole of the lower plate and whose end is protruding from said hole and is intended to contact a second electronic component, for example in the form of a wafer;

A generally elongated and deformable central body (11), flexible for example, said central body being interposed between said upper part and lower part;

And wherein said lower part (13) comprises an enlarged head (13D) developing for a certain longitudinal length and having transversal section greater than the transversal section of the central body, said enlarged head having an upper surface which connects to the central body with said upper surface which branches off radially from the central boy and having a lower surface (13D') which in use is intended to rest at least partially onto said surface of the lower plate (25, X), said lower surface (13D') being beveled so as to form an angle (α) with respect to said horizontal surface (25, X) onto which it rests in use in a rest condition of the unbuckled probe and, in condition of buckle of the probe, there is at least one buckled position in which said lower surface (13D') moves to rest entirely or substantially entirely onto the horizontal surface thus zeroizing said angle (α).

The invention claimed is:

1. A contact probe (10) for electronic tests comprising:
   an upper part (12) having an end portion (12'), said upper part having an end is disposed to contact a first electronic component;
   a lower part (13) having an end portion (13*c*), said lower part having an end disposed to contact a second electronic component; and
   an elongated and deformable central body (11), said central body being interposed between said upper part and said lower part;
   wherein said lower part (13) comprises an enlarged head (13D) having a lower surface (13D') disposed to rest at least partially onto a horizontal surface (25, X), said lower surface (13D') being configured so as to have an inclination angle (α) with respect to a horizontal surface (25, X) onto which said lower part rests in a rest condition of the unbuckled probe and,
   in a buckle condition of the probe, to have at least one buckled position in which said lower surface (13D') moves to rest entirely or prevalently onto the horizontal surface, thus zeroizing said inclination angle (α); and
   wherein said enlarged head (13D) comprises an upper surface which branches off radially from the central body, said enlarged head developing longitudinally for a predetermined length and ending with said lower surface (13D') which branches off radially from the end portion (13*c*) to which said lower surface is connected.

2. The contact probe (10), according to claim 1, wherein the inclination angle of such lower surface (13D') is such that, when the contact probe is positioned standing orthogonally with respect to said horizontal surface (25, X), said lower surface (13D') forms said inclination angle (α) with respect to the horizontal surface, and when the contact probe is buckled, at least one buckled position of said probe exists in which said lower surface (13D') moves to a parallel condition to said horizontal surface (25, X).

3. The contact probe (10), according to claim 1, wherein said enlarged head comprises an upper surface and said lower surface, said upper surface and said lower surface of said enlarged head being not parallel to each other, said lower surface of said enlarged head being inclined at said inclination angle with respect to said horizontal surface.

4. The contact probe (10), according to claim 1, wherein said lower part (13) has said end portion (13c) which ends with a lower contact surface, and wherein said lower surface (13D') of said enlarged head has said inclination angle (α) with respect to said horizontal surface when the probe is positioned resting onto a horizontal plane through said lower contact surface which rests in an orthogonal way with respect to the horizontal plane.

5. The contact probe (10), according to claim 1, wherein said enlarged head (13D) is centered with respect to the central body to which the enlarged head is connected and has a greater transversal section with respect to a transversal section of the central body (11) to which the enlarged head is connected.

6. The probe, according to claim 1, wherein said end portion (12') has a longitudinal development according to a direction (S) which forms a predetermined angle with respect to a longitudinal axis (Z).

7. The probe, according to claim 6, wherein said end portion (12") is formed by:
a rear wall (12"p), and
a front wall (12"a),
the front wall (12"a) forming a side opposite to the rear wall (12"p) which moves progressively away from the rear wall according to a predetermined angle to then connect again to the central body (11) through a transversal part (12"d), thus forming a tooth or step (12"d).

8. The probe, according to claim 1, wherein said lower surface (13D') is shaped as a bevel having a predetermined angulation.

9. The probe, according to claim 8, wherein said angulation is comprised between 1 and 7 degrees.

10. A probe head comprising:
one or more contact probes (10);
an upper plate (20) provided with one or more holes;
a lower plate (25) provided with one or more holes aligned with the holes of the upper plate; and
a connection support (31) for connecting the upper plate to the lower plate maintaining the upper and the lower plates spaced from each other for forming a seat for housing the one or more probes;
wherein each probe comprises:
an upper part (12) having an end portion (12') at least partially protruding from one of the one or more holes of the upper plate so that the end portion can be in contact, in use, with a first electronic component;
a lower part (13) having an end portion (13c) at least partially protruding from one of the one or more holes of the lower plate so that the end portion of the lower part can be in contact, in use, with a second electronic component;
an elongated and deformable central body (11), said central body being interposed between said upper part and said lower part and being housed in said seat; and
wherein said lower part (13) of the probe comprises an enlarged head (13D) having a lower surface (13D') which rests onto a surface of the lower plate (25), said lower surface (13D') being configured so that, in a rest condition of the probe when said probe is not buckled, said lower surface (13D') is inclined at an angle (α) with respect to the surface of the lower plate (25) and, after the probe has become buckled in work position, said lower surface (13D') is entirely lying onto the surface of the lower plate, thus zeroing said angle (α); and
wherein said enlarged head (13D) comprises an upper surface which branches off radially from the central body, said enlarged head developing longitudinally for a length and ending with said lower surface (13D') which branches off radially from the end portion (13c) to which said lower surface is connected.

11. The probe head, according to claim 10, wherein said one or more holes of the upper plate (25) are of such a size as to enable an insertion of one of the one or more contact probes inside the seat delimited by the upper and the lower plate through one of said one or more holes of the upper plate from above.

12. The probe head, according to claim 10, wherein said one or more holes of the upper and/or lower plates are frustoconical.

13. The probe head, according claim 10, wherein the lower plate (25) is mounted slidingly along a vertical guide (32) with respect to the connection support (31) so that said lower plate (25) is movable between a position spaced from the connection support, in which said probe is in the rest condition, and a position in which the lower plate is in contact against the connection support and with one of the one or more contact probes which is, when the lower plate is in contact against the connection support, buckled in a work condition.

14. The probe head, according to claim 13, wherein said vertical guide (32) is a threaded screw whose length is such that, screwed into a threaded hole of the support (31), the threaded screw supporting the lower plate (25) at a distance from the connection support (31).

15. The probe head, according to claim 10, wherein said enlarged head (13D) is centered with respect to the central body to which said enlarged head is connected and has a greater transversal section than a transversal section of the central body (11) to which said enlarged head is connected.

16. A method for mounting a probe head according to claim 10, the method comprising:
inserting the one or more contact probes from the one or more holes of the upper plate (25) so that each probe is positioned with an opposite end protruding from a corresponding hole of the lower plate (20), the lower plate being arranged with play with respect to the connection support to which the lower plate is fixed;
after inserting of all of the one or more contact probes, causing a sliding of the lower plate along a guide so as to move the lower plate against the connection support (31), thus eliminating a play; and
positioning the one or more probes in buckled work position, wherein, in said buckled work position, said lower surface (13D') is entirely resting onto a surface of the lower plate.

* * * * *